United States Patent [19]
Grabbe

[11] Patent Number: 5,653,598
[45] Date of Patent: Aug. 5, 1997

[54] ELECTRICAL CONTACT WITH REDUCED SELF-INDUCTANCE

[75] Inventor: Dimitry G. Grabbe, Middletown, Pa.

[73] Assignee: The Whitaker Corporation, Wilmington, Del.

[21] Appl. No.: 521,704

[22] Filed: Aug. 31, 1995

[51] Int. Cl.[6] .................................................. H01R 9/09
[52] U.S. Cl. ............................................. 439/66; 439/74
[58] Field of Search ............................. 439/65, 66, 88, 439/91, 81, 82, 74, 862, 70–72

[56] References Cited

U.S. PATENT DOCUMENTS

| | | | |
|---|---|---|---|
| 4,354,729 | 10/1982 | Grabbe et al. | 339/258 R |
| 4,511,197 | 4/1985 | Grabbe et al. | 339/17 CF |
| 4,513,353 | 4/1985 | Bakermans et al. | 361/399 |
| 4,647,124 | 3/1987 | Kandybowski | 339/17 CF |
| 4,655,519 | 4/1987 | Evans et al. | 339/17 |
| 4,699,593 | 10/1987 | Grabbe et al. | 439/71 |
| 4,906,194 | 3/1990 | Grabbe | 439/71 |
| 4,921,430 | 5/1990 | Matsuoka | 439/72 |
| 4,927,369 | 5/1990 | Grabbe et al. | 439/66 |
| 4,969,826 | 11/1990 | Grabbe | 439/66 |
| 5,092,783 | 3/1992 | Suarez et al. | 439/71 |
| 5,167,512 | 12/1992 | Walkup | 439/66 |
| 5,230,632 | 7/1993 | Baumberger et al. | 439/66 |
| 5,324,205 | 6/1994 | Ahmad et al. | 439/66 |
| 5,342,205 | 8/1994 | Hashiguchi | 439/66 |
| 5,437,556 | 8/1995 | Bargain et al. | 439/66 |
| 5,484,295 | 1/1996 | Mowry et al. | 439/66 |

Primary Examiner—David L. Pirlot

[57] ABSTRACT

An electrical contact for use in a connector between mutually opposed electrical interfaces comprises a generally planar contact body having first and second major faces. The body includes a pair of spaced apart spring arms connected by a resilient bight. The spring arms have respective free ends each with an outwardly facing edge which defines a contact nose engageable with a respective one of the interfaces. Respective shorting sections extend from each of the free ends generally toward each other. The shorting sections are offset from each other such that the first major face of one shorting section is coplanar with the second major face of the other shorting section. Upon deflection of the spring arms relatively closer together, the coplanar major faces of the shorting sections come into mutual engagement, whereby a shortened electrical path is formed between the contact noses.

8 Claims, 3 Drawing Sheets

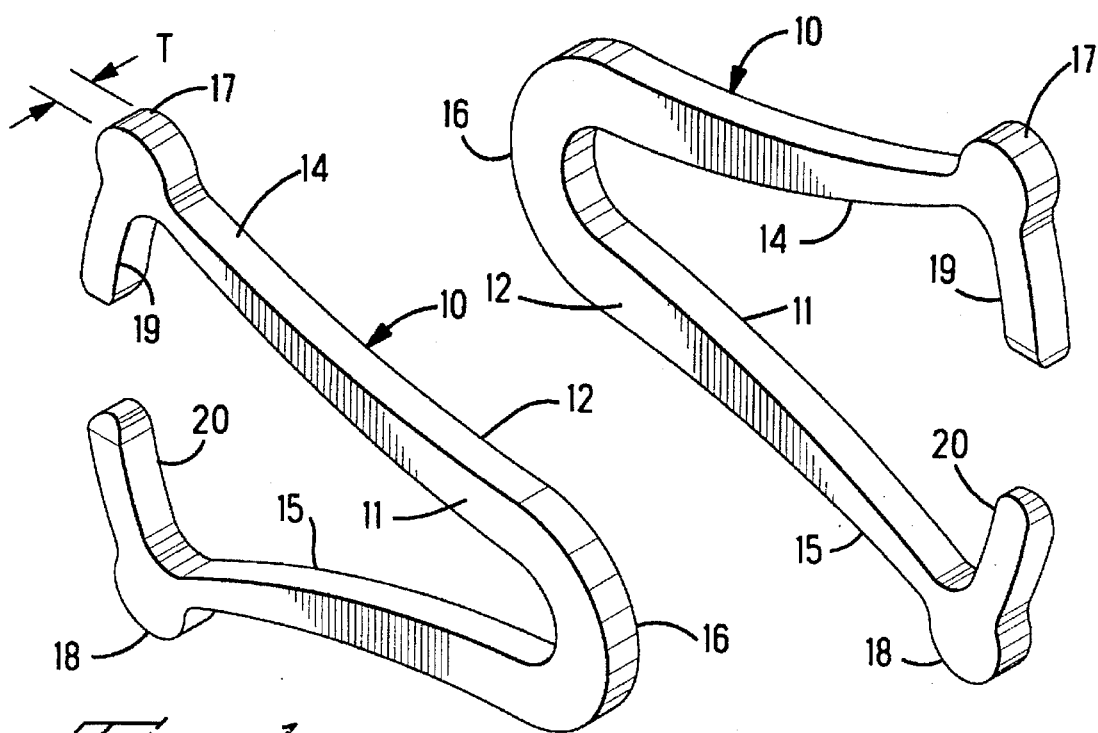
Fig. 1  Fig. 2
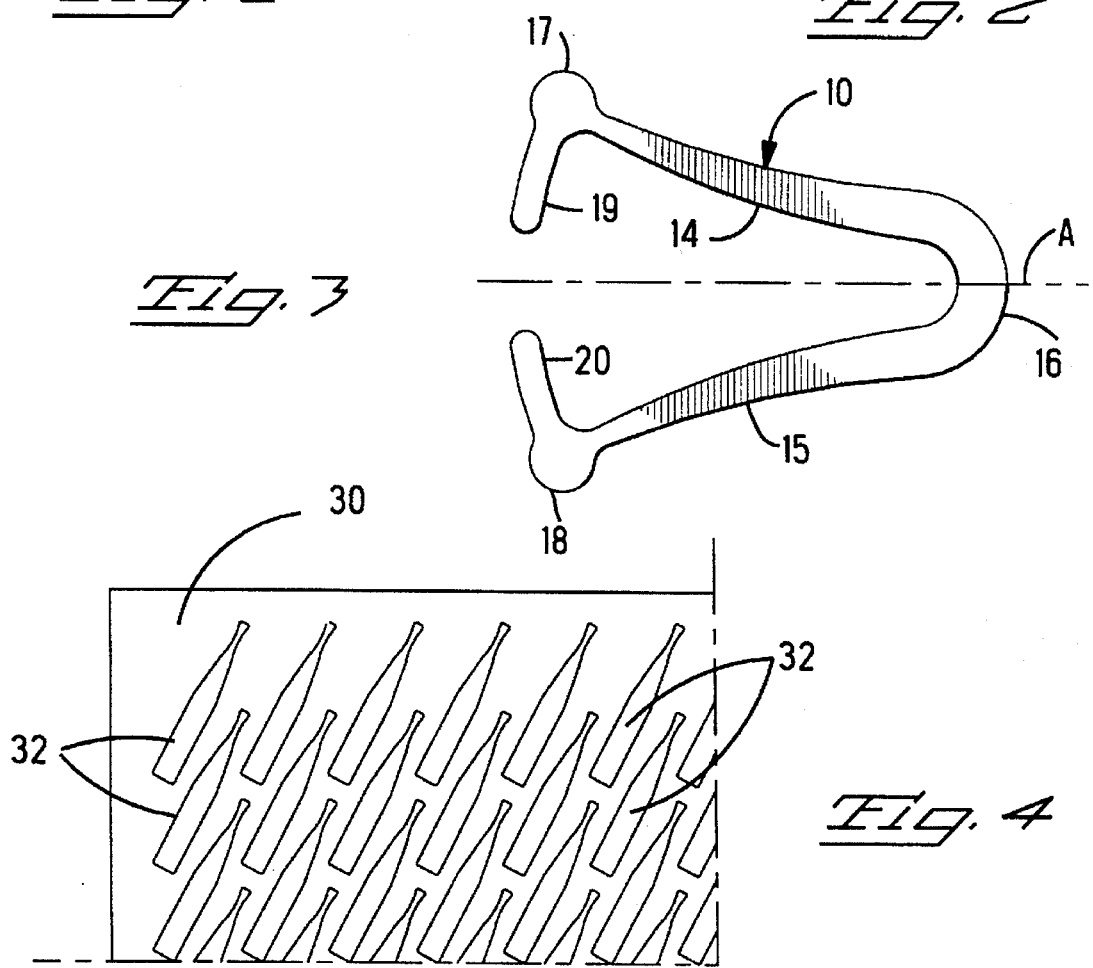
Fig. 3
Fig. 4

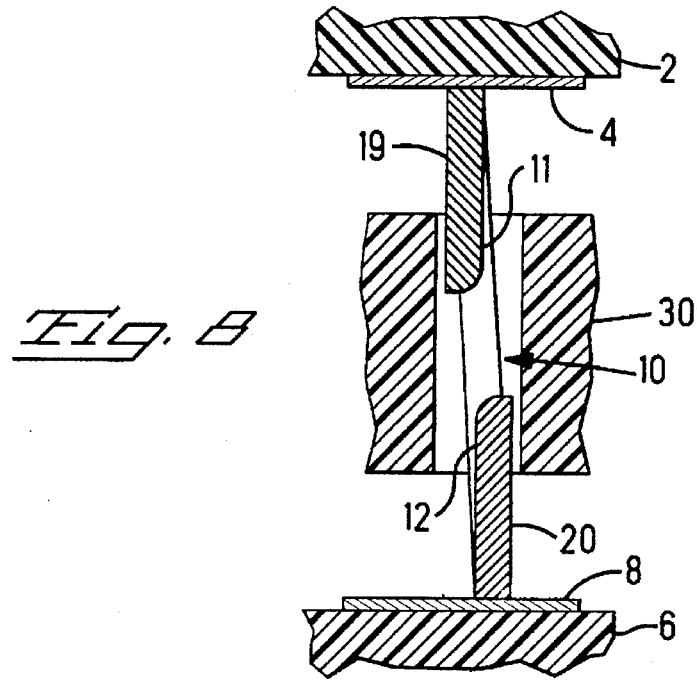
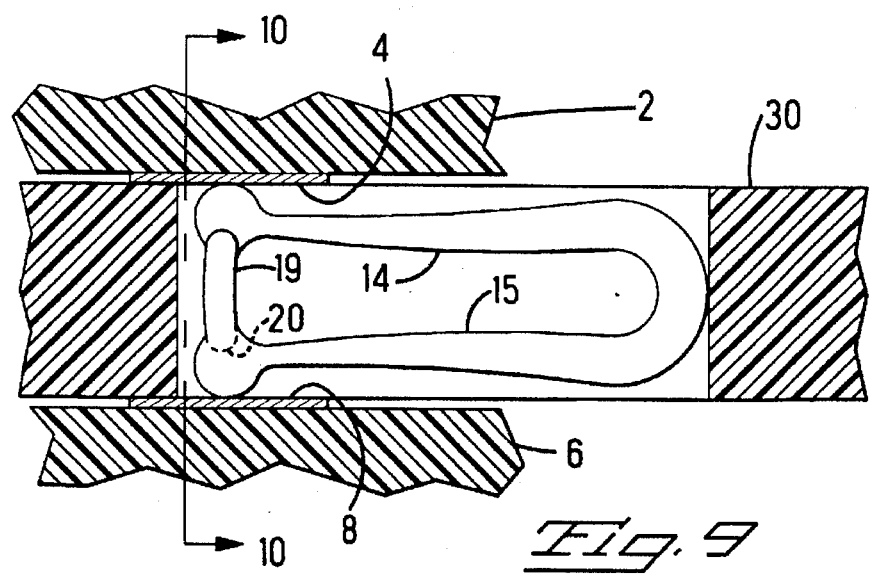
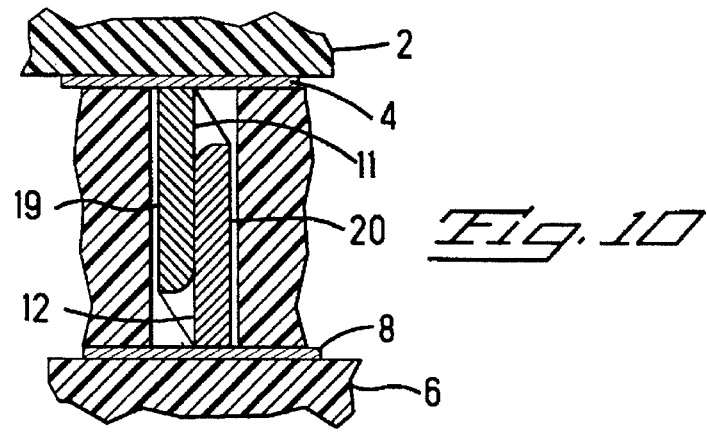

ELECTRICAL CONTACT WITH REDUCED SELF-INDUCTANCE

FIELD OF THE INVENTION

The invention relates to a very thin electrical contact which has shorting sections engageable with each other for reducing self-inductance effects in the contact.

BACKGROUND OF THE INVENTION

Electronic packages having leads arranged in a ball grid array (BGA) or a land grid array (LGA) are known. These packages have a relatively low height which is desirable for saving space in electronic assemblies. The packages may be surface mounted directly on a circuit board in a soldering process wherein the leads become solder bonded to a corresponding array of circuit pads on the board. However, solder bonding has the drawback that the package is not easily removable for replacement or upgrade. It is often desirable to provide a connector for mounting the electronic package on the circuit board in a separable fashion.

Connectors are known for removably mounting a BGA or LGA package on a circuit board. Such connectors are disclosed in U.S. Pat. No. 4,511,197; 4,513,353; 4,647,124; and 4,699,593. These connectors comprise a substantially flat dielectric housing which resides between the electronic package and the circuit board. The housing has an array of cavities in which are disposed electrical contacts arranged in correspondence with the array of leads of the electronic package. Each of the contacts has a pair of oppositely extending noses which project beyond external surfaces of the connector housing. When the package is mounted on the connector, each of the contacts has one nose engaged with a respective lead of the package and the other nose engaged with a respective pad on the board. A compressive force is applied to the package and the board to assure firm engagement of each nose with its respective lead or pad. Typically, the compressive force may be applied by pressure plates which are fastened together to sandwich the package, connector and board therebetween.

In packaging electronic components, consideration must be given to horizontal and vertical space limitations, and the nature of the assembly often dictates parameters on the space limitations. For example, in packaging lap top computers, vertical space is much more valuable than horizontal space. Design requirements for a future laptop computer call for a connector only 0.032 inch high and a working range of 0.015 inch. The working range is a very large percentage of the total connector height, thus making the contact design quite difficult. Accordingly, it is an object of the invention to provide a contact having a low overall height and a large working range.

Further, modern electrical equipment may operate at very high switching frequencies, and this can give rise to significant self-inductance effects which may interfere with proper operation of the equipment. Self-inductance effects can be reduced by reducing the length of the circuit path through the contact. However, it is desirable for the contact to have a relatively long spring arm to provide compliance which is necessary to permit deflection of the contact without plastic deformation. In order to overcome the problem posed by these competing interests, contacts have been developed with spring arms for compliancy and a shorting arm which interconnects free ends of the spring arms to provide a shorter current path through the contact. One such contact is disclosed in U.S. Pat. No. 4,354,729, wherein a shorting arm 68 has a side edge in sliding engagement with side edge 79 of latch arm 54. Contacts such as this are becoming increasingly miniaturized, and as the thickness of the contact is decreased, it becomes increasingly difficult to mate the side edges of arms 68 and 74. Accordingly, it is an object of the invention to lower the self-inductance effect in a contact made from very thin material.

SUMMARY OF THE INVENTION

An electrical contact for use in a connector between mutually opposed electrical interfaces comprises a generally planar contact body having first and second major faces. The body includes a pair of spaced apart spring arms connected by a resilient bight portion. The spring arms have respective free ends each with an outwardly facing edge which defines a contact nose engageable with a respective one of the interfaces. Respective shorting sections extend from each of the free ends generally toward each other. The shorting sections are offset such that, upon deflection of the spring arms relatively closer together, the shorting sections overlap and the first major face of one shorting section engages the second major face of the other shorting section, whereby a shortened electrical path is formed between the contact noses.

BRIEF DESCRIPTION OF THE DRAWINGS

The invention will now be described by way of example with reference to the accompanying drawings in which like elements in different figures thereof are identified by the same reference numeral and wherein:

FIGS. 1 and 2 are isometric views of a contact according to the invention from opposite sides.

FIG. 3 is a side view of the contact.

FIG. 4 is a top view of a portion of a connector having cavities which can receive the contact.

FIG. 8 is a cross-sectional view taken along line 8—8 of FIG. 7.

FIG. 9 is a cross-sectional view of the contact in deflected condition in a connector between electrical interfaces.

FIG. 10 is a cross-sectional view taken along line 10—10 of FIG. 9.

BRIEF DESCRIPTION OF THE PREFERRED EMBODIMENT

Figure 5:
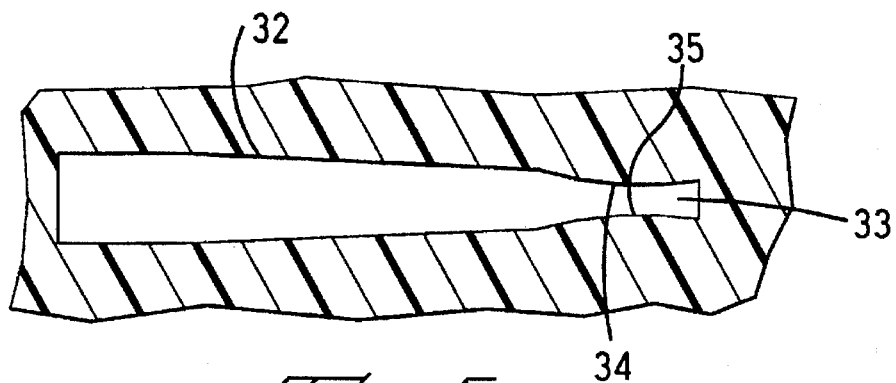
FIG. 5 is an enlarged view of an empty cavity in the connector.

With reference to FIGS. 1–3, a contact according to the invention is preferably stamped from sheet material to form a generally planar contact body 10 having first and second major faces 11, 12 corresponding to surfaces of the material from which it is stamped, with a thickness T of approximately 0.0045 inch. The contact body 10 includes a pair of spring arms 14, 15 which are connected at one end by a resilient bight portion 16. The bight portion 16 is preferably an arcuate section which enhances flexibility in the plane of the contact body, although the bight portion 16 may be defined more sharply by an intersection of the arms 14, 15 at an acute angle. In the preferred embodiment the bight portion 16 is bisected by central axis A of the contact.

The arms 14, 15 are spaced apart at some dimension when the contact is in an undeflected state. Preferably, the arms angularly diverge as they extend from the bight portion 16, although the arms may be parallel to each other. The arms also extend slightly out of the plane of the contact body as they extend away from the bight portion. The arms have respective free ends with outwardly facing edges defining a pair of oppositely facing contact noses 17, 18 each engageable with a respective ball or pad of a circuit element. Respective shorting sections 19, 20 extend from each of the free ends generally toward each other. The shorting sections are offset slightly from each other due to the arms extending slightly out of the plane of the contact body for reasons that will be more fully explained hereinafter.

Figure 6:
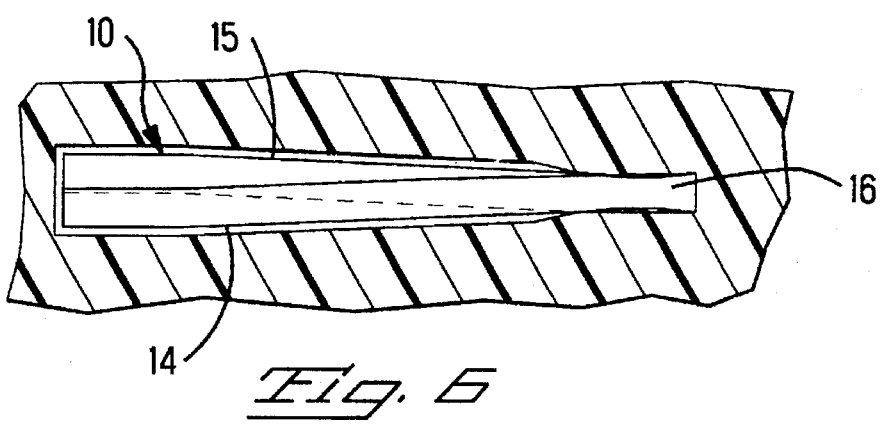
FIG. 6 is an enlarged view of a cavity with a contact therein.

The contact is useful in a connector for electrically connecting a first electrical interface, such as leads of an electronic package, to a second electrical interface, such as circuit paths on a circuit board. There is shown in FIG. 4 a top view of a portion of such a connector which includes a connector body 30 made from plastic or other dielectric material having a plurality of contact cavities 32. The cavities 32 are arranged in an array corresponding to the array of leads of the electronic package to be mounted on the connector. Each of the cavities 32 is an elongated slot which extends through the connector body from top to bottom thereof. As shown more clearly in FIGS. 5 and 6, each of the cavities 32 has a contact retention section 33 defined by opposed surfaces 34, 35 which are spaced apart at a dimension selected to produce a slight interference fit with the contact body near the bight portion when the contact is disposed therein.

Figure 7:
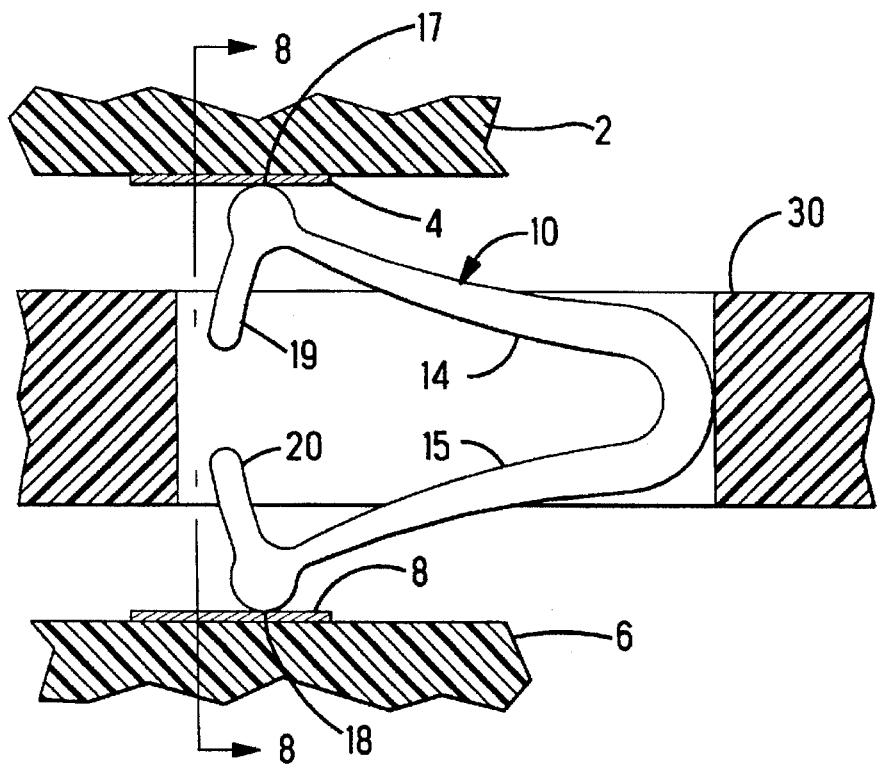
FIG. 7 is a cross-sectional view of the contact in undeflected condition in a connector between electrical interfaces.

FIGS. 7 and 8 show cross-sectional views of a representative contact 10 in undeflected condition in a connector 30 which serves to electrically connect an electronic package 2 to a circuit board 6. The package has electrical leads each in the form of a contact pad 4, the leads being disposed in a standardized array over a face of the package. Instead of contact pads, the package could have an array of solder balls, the contact of the present invention being engageable with either ball or pad type leads. The circuit board 6 has an array of contact pads 8 corresponding to the array of pads 4 of the package. The noses 17, 18 of the contact are engaged by the pads 4, 8 when the package 2 is urged against the connector 30. The package may be urged against the connector such as by pressure plates (not shown) arranged above the package and below the circuit board and secured together with threaded fasteners, thereby sandwiching the package, the connector and the circuit board therebetween.

As best seen in FIG. 8, the first major face 11 of the shorting section 19 is substantially coplanar with the second major face 12 of the shorting section 20. Thus, the shorting sections are poised for mutual engagement along their respective major faces upon deflection of the contact.

When the connector is clamped between the package and the board, the contact is compressed to the deflected condition shown in FIGS. 9 and 10, thereby deflecting the spring arms 14, 15 to a position where they are relatively closer together. In this position the shorting sections 19, 20 overlap and, as best seen in FIG. 10, the first major face 11 of the shorting section 19 engages the second major face 12 of the other shorting section 20, thereby producing a short and direct electrical path between the contact noses 17, 18. The shorter electrical path has lower electrical resistance than the longer path which extends through both of the spring arms 14, 15. Current flow will favor the lower resistance path, of course, and the shorter path results in a reduced self-inductance effect when compared to the longer path through the spring arms. By engaging the shorting sections along their major faces instead of their side edges, the problem of aligning and mutually engaging very thin side edges, such as those having a thickness of 0.0045 inch, is avoided.

As the contact is compressed, the noses 17, 18 exert a slight wiping action along the pads 4, 8 due to changing angularity between the arms 14, 15. This wiping action serves to clean the pads 4, 8 by rubbing away dirt and oxides which may have accumulated.

A contact according to the invention is preferably made of a spring temper alloy in which a substantial portion consists of precious metals, such as palladium, gold, or silver, as well as nickel and other non-precious metals. A consideration in material selection, in addition to spring characteristics, is the ability of the contact to mate with a solder lead without transfer of tin from the solder lead to the contact. Of the non-noble metals, beryllium-nickel alloy meets that requirement, as do the above-listed precious metals. Since these materials are quite expensive, efficient material utilization is an important factor in deciding on the shape of the spring contact. The invention contributes to efficient material utilization because a very dense arrangement of the contacts can be patterned on a material strip, thereby minimizing material scrap which is leftover after contact stamping.

A contact according to the invention has several advantages. The contact can be made very small yet it has high compliancy which results in a working range which is approximately fifty percent of its undeflected height. The contact has shorting sections which reduce self-inductance effects. The shorting sections engage along their major faces, thereby avoiding the difficulty of aligning very thin side edges for mutual engagement. Also, the shape of the contact minimizes material scrap during manufacture.

The invention having been disclosed, a number of variations will now become apparent to those skilled in the art. Whereas the invention is intended to encompass the foregoing preferred embodiments as well as a reasonable range of equivalents, reference should be made to the appended claims rather than the foregoing discussion of examples, in order to assess the scope of the invention in which exclusive rights are claimed.

I claim:

1. An electrical contact for use in a connector between mutually opposed electrical interfaces, comprising:

a generally planar contact body having first and second major faces, the body including a pair of spaced apart spring arms connected by a resilient bight portion, the spring arms having respective free ends each with an outwardly facing edge which defines a contact nose engageable with a respective one of the interfaces, and that respective shorting sections extending from each of the free ends generally toward each other and being offset such that, upon deflection of the spring arms relatively closer together, the shorting sections overlap and the first major face of one shorting section engages the second major face of the other shorting section, whereby a shortened electrical path is formed between the contact noses while the spring arms, the bight portion, and the shorting section lie in a common plane.

2. The contact according to claim 1, wherein the bight portion is an arcuate section of the contact body.

3. The contact according to claim 1, wherein the bight portion is bisected by a central axis of the contact body.

4. The contact according to claim 1, wherein the spring arms angularly diverge as they extend from the bight portion.

5. An electrical contact for use in a connector between mutually opposed electrical interfaces, comprising:

a generally planar contact body stamped from sheet material, the body having first and second major faces corresponding to opposite side surfaces of the sheet material, the body including a resilient bight portion and a pair of spaced apart spring arms extending from the bight portion, the spring arms having respective free ends each with an outwardly facing edge which defines a contact nose engageable with a respective one of the interfaces, and respective shorting sections extending from each of the free ends generally toward each other and being offset such that the first major face of one shorting section is substantially coplanar with the second major face of the other shorting section, whereby upon deflection of the spring arms relatively closer together, the substantially coplanar major faces of the respective shorting sections come into mutual engagement, while the spring arms, the bight portion, and the shorting sections lie in a common plane so as to form a shortened electrical path is formed between the contact noses.

6. The contact according to claim 5, wherein the bight portion is an arcuate section of the contact body.

7. The contact according to claim 5, wherein the bight portion is bisected by a central axis of the contact body.

8. The contact according to claim 5, wherein the spring arms angularly diverge as they extend from the bight portion.

\* \* \* \* \*